(12) United States Patent
Chen et al.

(10) Patent No.: US 11,055,214 B2
(45) Date of Patent: Jul. 6, 2021

(54) MEMORY CONTROLLER AND METHOD HAVING PREDICTIVE BUFFERING OF ADDRESS MAPPING TABLE

(71) Applicant: RayMX Microelectronics, Corp., Anhui province (CN)

(72) Inventors: Yen-Chung Chen, Zhubei (TW); Jiunn-Jong Pan, Zhubei (TW); Wei-Ren Hsu, Taipei (TW); Yi-Ting Wei, Taipei (TW)

(73) Assignee: RAYMX MICROELECTRONICS, CORP., Anhui Province (CN)

( * ) Notice: Subject to any disclaimer, the term of this patent is extended or adjusted under 35 U.S.C. 154(b) by 71 days.

(21) Appl. No.: 16/433,145

(22) Filed: Jun. 6, 2019

(65) Prior Publication Data

US 2020/0073794 A1     Mar. 5, 2020

(30) Foreign Application Priority Data

Aug. 31, 2018  (TW) ................... 107130625

(51) Int. Cl.
*G06F 12/02* (2006.01)
*G11C 16/10* (2006.01)
*G06F 12/1009* (2016.01)

(52) U.S. Cl.
CPC ...... *G06F 12/0246* (2013.01); *G06F 12/1009* (2013.01); *G11C 16/102* (2013.01);
(Continued)

(58) Field of Classification Search
CPC ............. G06F 12/0246; G06F 12/1009; G06F 2212/1024; G06F 2212/2022;
(Continued)

(56) References Cited

U.S. PATENT DOCUMENTS 5,485,590 A     1/1996  Hyatt et al.
9,529,722 B1 *  12/2016  Tang .................. G06F 12/0862
(Continued)

FOREIGN PATENT DOCUMENTS

FR    2657441 A1   7/1991
TW    I629591 B    7/2018

OTHER PUBLICATIONS

TW Office Action dated May 20, 2019 in corresponding Taiwan application (No. 107130625).

*Primary Examiner* — Larry T Mackall
(74) *Attorney, Agent, or Firm* — McClure, Qualey & Rodack, LLP (57) ABSTRACT

The present invention provides a memory controller including an artificial intelligence (AI) module and a microprocessor. In the operations of the memory controller, the AI module receives a read command from a host device, and generates an auxiliary command according to the read command. The microprocessor is configured to select a first L2P mapping table according to a logical address included in the read command, and refer to the first L2P mapping table to read data from a memory module. The microprocessor is further configured to read a second L2P mapping table from the memory module according to the auxiliary command, wherein the second L2P mapping table does not include the logical address included in the read command.

18 Claims, 4 Drawing Sheets

(52) U.S. Cl.
CPC ............... *G06F 2212/2022* (2013.01); *G06F 2212/7201* (2013.01)

(58) Field of Classification Search
CPC ..... G06F 2212/7201; G06F 2212/7203; G11C 16/102
See application file for complete search history.

(56) References Cited

U.S. PATENT DOCUMENTS

| | | | |
|---|---|---|---|
| 2003/0204674 A1* | 10/2003 | Ryan | G11C 7/1006 711/137 |
| 2017/0083234 A1* | 3/2017 | Lin | G06F 3/061 |
| 2018/0089087 A1* | 3/2018 | Chang | G06F 12/0862 |
| 2018/0284735 A1* | 10/2018 | Celia | H04L 1/0002 |
| 2019/0065394 A1 | 2/2019 | Lee et al. | |
| 2019/0102096 A1* | 4/2019 | Loewen | G06F 3/0625 |

* cited by examiner

FIG. 1

| Logical address | Physical address |
|---|---|
| LBA_0 | xxxx |
| LBA_1 | xxxx |
| LBA_2 | xxxx |
| ⋮ | ⋮ |
| LBA_1023 | xxxx |

210_1

| Logical address | Physical address |
|---|---|
| LBA_1024 | xxxx |
| LBA_1025 | xxxx |
| LBA_1026 | xxxx |
| ⋮ | ⋮ |
| LBA_2047 | xxxx |

210_2

| Logical address | Physical address |
|---|---|
| LBA_2048 | xxxx |
| LBA_2049 | xxxx |
| LBA_2050 | xxxx |
| ⋮ | ⋮ |
| LBA_3071 | xxxx |

MEMORY CONTROLLER AND METHOD HAVING PREDICTIVE BUFFERING OF ADDRESS MAPPING TABLE

BACKGROUND OF THE INVENTION

1. Field of the Invention

The present invention relates to a memory controller.

2. Description of the Prior Art

When a memory controller (e.g., flash memory controller) receives a read command from a host device, the memory controller refers to an internal logical address to physical address mapping table (hereinafter, L2P mapping table) to convert a logical address included in the read command into a physical address, then the memory controller is able to read the required data from a memory module by referring to the physical address, and send the data to the host device. However, because a size of the memory module becomes larger, a plurality of L2P mapping tables are required for the address converting operations, and an internal buffer memory of the memory controller may not enough to store all of the L2P mapping tables. Therefore, the L2P mapping tables that are not required currently will be stored into the memory module to prevent the L2P mapping tables from occupying too much space of the buffer memory.

Because most of the L2P mapping tables are stored in the memory module, and the L2P mapping tables are loaded to the buffer memory of the memory controller only when the L2P mapping tables are to be used. However, the steps of loading the L2P mapping tables from the memory module may lower the total reading speed, and the system efficiency may be worsened.

SUMMARY OF THE INVENTION

It is therefore one of objectives of the present invention to provide a memory controller, which can predict a required L2P mapping table according to the current read command, and load the required L2P mapping table from the memory module in advance and store the loaded L2P mapping table into the internal buffer memory of the memory controller. Therefore, if the memory controller receives the related read command later, the memory controller can immediately use the pre-loaded L2P mapping table to process the read command, to improve the system efficiency.

In a first embodiment of the present invention, a memory controller comprising an artificial intelligence (AI) module and a microprocessor is disclosed. In the operations of the memory controller, the AI module receives a read command from a host device, and generates an auxiliary command according to the read command. The microprocessor is configured to select a first L2P mapping table according to a logical address included in the read command, and refer to the first L2P mapping table to read data from a memory module. The microprocessor is further configured to read a second L2P mapping table from the memory module according to the auxiliary command, wherein the second L2P mapping table does not include the logical address included in the read command.

In a second embodiment of the present invention, a method for accessing a memory module is disclosed, and the method comprises the steps of: reading a read command from a host device; generating an auxiliary command according to the read command; selecting a first L2P mapping table according to a logical address included in the read command, and refer to the first L2P mapping table to read data from a memory module; and reading a second L2P mapping table from the memory module according to the auxiliary command, wherein the second L2P mapping table does not include the logical address included in the read command.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
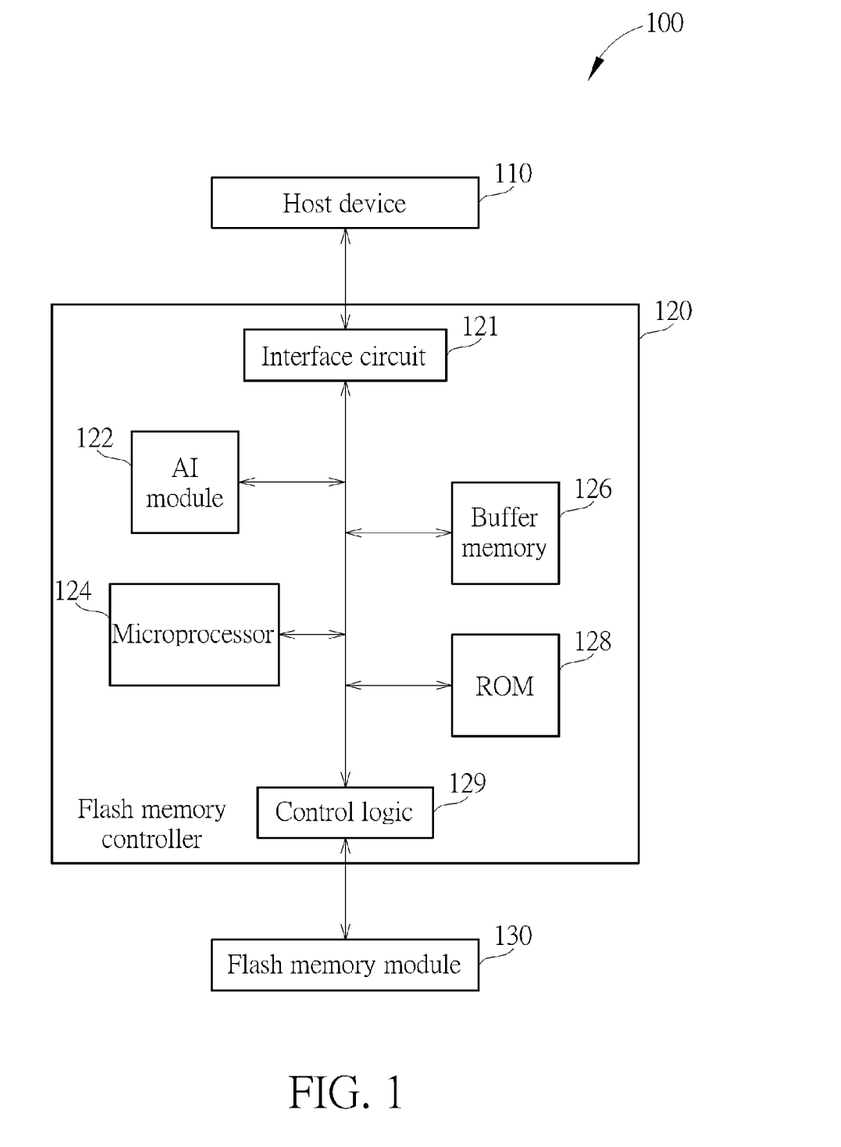
FIG. 1 is a diagram illustrating an electronic device according to one embodiment of the present invention.

FIG. 1 is a diagram illustrating an electronic device 100 according to one embodiment of the present invention. As shown in FIG. 1, the electronic device 100 comprises a host device 110, a memory controller 120 and a memory module 130, where the memory controller 120 comprises an interface circuit 121, an AI module 122, a microprocessor 124, a buffer memory 126, a read only memory (ROM) 128 and a control logic 129. The ROM 128 is used to store program codes, and the microprocessor 124 is configured to execute the program codes to control the access of the memory module 130, and the elements within the memory controller 120 may communicate with each other via a bus shown in FIG. 1. In this embodiment, the memory controller 120 and the memory module 130 can be regarded as a solid-state drive (SSD), the electronic device 100 can be any computer or server having the SSD, and the host device 110 can be a processor configured to access the memory module 130 via the memory controller 120. The interface circuit 121 can be a Peripheral Component Interconnect Express (PCI-e) interface or an Advanced Technology Attachment (ATA) interface or Universal Serial Bus (USB) interface. The AI module 122 can also be called a Machine Learning module.

The memory module 130 comprises at least one memory chip, each memory chip comprises a plurality blocks, each block comprises a plurality of pages. In the designs of the memory, each block is a minimum erasing unit, that is all the data within the block must be erased together, and only deleting a portion of the data of the block is not allowed. In addition, each page is a minimum writing unit.

Figure 2:
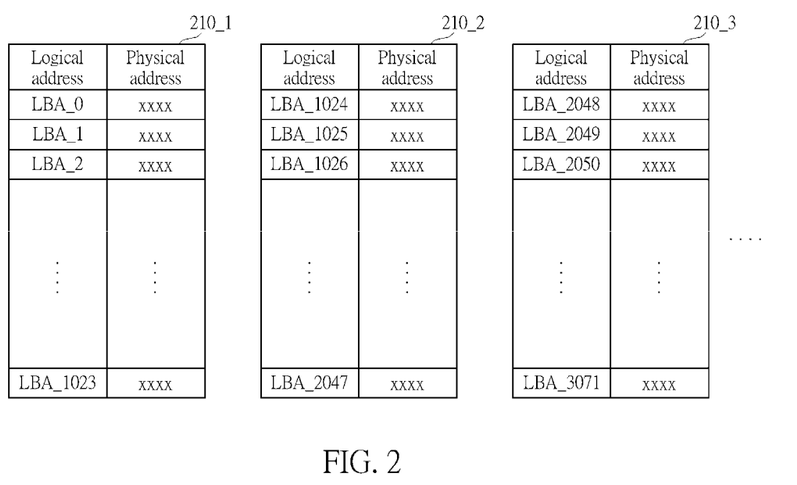
FIG. 2 is a diagram illustrating a plurality of L2P mapping tables stored in the memory module according to one embodiment of the present invention.

The memory module 130 has an area for storing a plurality of L2P mapping tables, wherein each of the L2P mapping tables comprises a plurality of consecutive logical addresses and/or corresponding physical addresses, and each physical address is an index of a block and a page index of the block. FIG. 2 shows the plurality of L2P mapping tables 210_1-210_3 stored in the memory module 130 according to one embodiment of the present invention. The L2P mapping table 210_1 comprises logical addresses LBA_0-LBA_1023 and the corresponding physical addresses, the L2P mapping table 210_2 comprises logical addresses LBA_1024-LBA_2047 and the corresponding physical addresses, and the L2P mapping table 210_3 comprises logical addresses LBA_2048-LBA_3071 and the corresponding physical addresses. It is noted that the L2P mapping tables 210_1-210_3 shown in FIG. 2 are for illustrative purposes only, without a limitation of the present invention. For example, the quantity of the logical addresses within each of the L2P mapping tables may be different, and not all of the logical addresses have the corresponding physical addresses (i.e., a portion of the logical addresses do not have the corresponding physical addresses, or the corresponding physical addresses are invalid contents).

In an embodiment, the AI module 122 has an independent circuit architecture that can continuously generate and update a plurality of decision logics for subsequent use by continuously receiving successive read commands and performing analysis. In this embodiment, the decision logics of the AI module 122 are used to determine or predict the order relationship between the read commands from the host device 110, especially the order relationship between the logical addresses comprised in the read commands, and the order relationship between the L2P mapping tables corresponding to the logical addresses comprised in the read commands. Therefore, the AI module 122 can determine/predict a next read command following a current read command received from the host device 110, in order to load the required L2P mapping table from the memory module 130 in advance. Specifically, the AI module 122 continuously receives the read commands from the host device 110 when the electronic device 100 is operating, and generates the decision logics that can be used to determine the order relationships of the read commands through recording and training. For example, if the AI module 122 receives the read command asking for the data with the logical address LBA_123 and immediately receives the next read command asking for the data with the logical address LBA_2500 many times, the AI module 122 can learn and determine that the host device 110 has a high probability to send the successive read commands for the data having the logical addresses LBA_123 and LBA_2500, and the AI module 122 can build the decision logics indicating that the logical address LBA_2500 is immediately after the logical address LBA_123. In this embodiment, because the logical address LBA_123 and the logical address LBA_2500 are included in the L2P mapping tables 210_1 and 210_3, respectively, the AI module 122 can build the decision logics indicating that the L2P mapping tables 210_3 is immediately after the L2P mapping tables 210_1. Therefore, when the AI module 122 receives the read command having the logical address LBA_123 from the host device 110, the AI module 122 can determine that it is very likely that the host device 110 may immediately send the read command having the logical address LBA_2500, and the L2P mapping table 210_3 is required for the read command having the logical address LBA_2500, so the AI module 122 can notify the microprocessor 124 to perform some preprocesses.

In one embodiment, the AI module 122 employs a Deep Learning algorithm. In one embodiment, the AI module 122 utilizes an artificial neural network (ANN) architecture to predict the next read command based on the current read command. In this embodiment, the decision logics are weighting values of the nodes in artificial neural network (ANN) architecture. In a preferred embodiment, the ANN architecture can be a Deep Convolutional Network (DCN) architecture or a Neural Turing Machine (NTM) architecture. In another embodiment, the AI module 122 includes an AI circuit and a memory unit (not shown in FIG. 1) for storing a predetermined AI algorithm and the AI circuit loads the predetermined AI algorithm to perform deep learning on the plurality of read commands. In an embodiment, the memory controller 120 can be implemented by an application-specific integrated circuit (ASIC).

In one embodiment, the decision logics trained by the AI module 122 describe the order the L2P mapping tables that the memory controller sequentially requires to read from the memory module 130. For example, assuming that the AI module 122 sequentially receives the plurality of read command comprising the logical addresses LBA_123, LBA_2500, LBA_300, LBA_301, LBA_130, LBA_302, respectively, because these logical addresses correspond to the L2P mapping tables 210_1, 210_3, 210_1, 210_1, 210_2, 210_1, respectively, the AI module 122 can determine that the memory controller 120 needs to sequentially read the L2P mapping tables 210_1, 210_3 and 210_2 from the memory module 130, and the decision logics of the AI module 122 can be generated or updated accordingly.

In one embodiment of the present invention, due to considerations of the ability and the efficiency of the AI module 122, the AI module 122 can be designed to receive a plurality of specific read commands from the host device 110 to generate the decision logics only at a specific period that the electronic device 100 executes at least one specific operation. For example, because the user is most concerned about the boot time of the electronic device 100 and the startup time of some specific software/applications, the user may set the AI module 122 via an user interface of the electronic device 100 to make the AI module 122 be trained to generate/update the decision logics only when the electronic device 100 is powered on or the electronic device 100 executes some specific software/applications, that is the AI module 122 is not trained to generate/update the decision logics at other times. Specifically, by using the setting of the user, the AI module 122 can always perform the training operations within seven seconds after the electronic device 100 is powered on, to generate/update the decision logics. Because every time the data/files to be read when the electronic device 100 is powered on have a great similarity, by performing the training operations when the electronic device 100 is powered on many times, the AI module 122 can accurately and efficiently complete the training of the decision logics. In addition, because the decision logics of the AI module 122 are not updated after seven seconds of the electronic device 100 being powered on, the decision logics are not interfered by the disordered read commands generated according to the other operations of the electronic device 100. In another example, by using the setting of the user, the AI module 122 can always perform the training operations within four seconds after the electronic device 100 executes a specific application, to generate/update the decision logics, to make the AI module 122 accurately and efficiently complete the training of the decision logics. In addition, because the decision logics of the AI module 122 are not updated after four seconds of the electronic device 100 executing the specific application, the decision logics are not interfered by the disordered read commands generated according to the other operations of the electronic device 100.

In this embodiment, the user can stop the training operations of the AI module 122 via the user interface at any time, that is AI module 122 stop updating the decision logics. For example, assuming that the AI module 122 has updated the decision logics during ten startup procedures of the electronic device 100, the AI module 122 may stop training the decision logics to lower the system loading because the decision logics should be sufficient to reflect the order of the read commands or the order of requirements of the L2P mapping tables when the electronic device 100 is powered on.

In the operations of the electronic device 100, when the memory controller 120 receives a read command from the host device 110, the AI module 122 will analyze the logical address comprised in the read command (i.e. the logical address corresponding to data requested by the read command) and/or a corresponding L2P mapping table, and determine an auxiliary command according to the internal decision logics, where the auxiliary command comprises another L2P mapping table that is determined to be immediately the L2P mapping table in the previous training operations of the AI module 122. For example, assuming that the AI module 122 builds the decision logics indicating that the logical address LBA_2500 is immediately after the logical address LBA_123, or the L2P mapping table 210_3 is immediately after the L2P mapping table 210_1 in the previous training operations, if the read command received by the memory controller 120 comprises the logical address LBA_123, the auxiliary command generated by the AI module 122 will comprise the L2P mapping table 210_3.

Then, the microprocessor 124 refers to the logical address included in the read command to determine the corresponding L2P mapping table. At this time, if the buffer memory 126 already has the corresponding L2P mapping table, the microprocessor 124 can directly refer to this corresponding L2P mapping table to determine a physical address of the memory module 130. If the buffer memory 126 does not have the corresponding L2P mapping table, the microprocessor 124 loads the corresponding L2P mapping table from the memory module 130, and the microprocessor 124 refers to the loaded corresponding L2P mapping table to determine the physical address of the memory module 130. Then, the memory controller 120 reads data from the physical address of the memory module 130, and immediately transmits the data to the host device 110. In addition, if the memory controller 120 and the memory module 130 are idle, the microprocessor 124 further reads the L2P mapping table included in the auxiliary command from the memory module 130 (it is noted that, this step may be ignored if the buffer memory 126 already has the L2P mapping table included in the auxiliary command). It is noted that, at this time the memory controller 120 does not receive a next command of the read command yet, and the memory controller 120 does not need the L2P mapping table included in the auxiliary command currently, and the L2P mapping table included in the auxiliary command does not include any logical address in the current read command. In other words, in the time range that the microprocessor 124 receives the read command and the microprocessor 124 reads the L2P mapping table included in the auxiliary command from the memory module 130, the microprocessor 124 does not receive any read command that requires the L2P mapping table included in the auxiliary command.

For example, assuming that the read command includes the logical address LBA_123 and the auxiliary command includes the L2P mapping table 210_3, the memory controller 120 immediately reads the L2P mapping table 210_1 having the logical address LBA_123 from the memory module 130 (if the buffer memory does not have the L2P mapping table 210_1), and refers to the L2P mapping table 210_1 to determine a physical address corresponding to the logical address LBA_123, and refers to the physical address to read the data from the memory module 130, and transmits the data to the host device 110. Then, the memory controller 120 reads the L2P mapping table 210_3 from the memory module 130 in advance, and stores the L2P mapping table 210_3 into the buffer memory 126.

Then, if the memory controller 120 receives the other read command including the logical address LBA_2500, because the L2P mapping table 210_3 has been stored in the buffer memory 126, the memory controller 120 can directly refer to the L2P mapping table 210_3 stored in the buffer memory 126, without reading the L2P mapping table 210_3 from the memory module 130, to determine the physical address corresponding to the logical address LBA_2500, and the microprocessor 124 refers to the physical address to read the data from the memory module 130, and transmits the data to the host device 110. In light of above, because the other read command can be processed without loading the L2P mapping table 210_3 from the memory module 130, the reading speed becomes faster, and the efficiency of the electronic device 100 can be improved.

On the other hands, if the memory controller 120 does not receive another read command that requires the L2P mapping table 210_3 for a period of time, the memory controller 120 can delete the L2P mapping table 210_3 from the buffer memory 126 at an appropriate time to release the memory space.

In an embodiment, a format of the auxiliary read command and that of the read command are the same. In other embodiment, the auxiliary read command is just an index of L2P mapping table. In other embodiment, the auxiliary read command is just a logical block address (LBA) corresponding to the L2P mapping table It is noted that quantity of the logical block addresses of the read commands in the above embodiment as a feature for machine learning, but the invention is not limited thereto. In other embodiments of the present invention, the AI module 122 can also utilize a logical block address and at least one of the following features of the access command for machine learning: a length of the access command, a type of the access command, and an interval time of the access command etc. In this embodiment, at least one of the logical block address, the length, the type, and the interval time of the access command is the input of the AI module 122, the decision logic is weighting value of the AI module 122, and the auxiliary read command is the output of the AI module 122.

Figure 3:
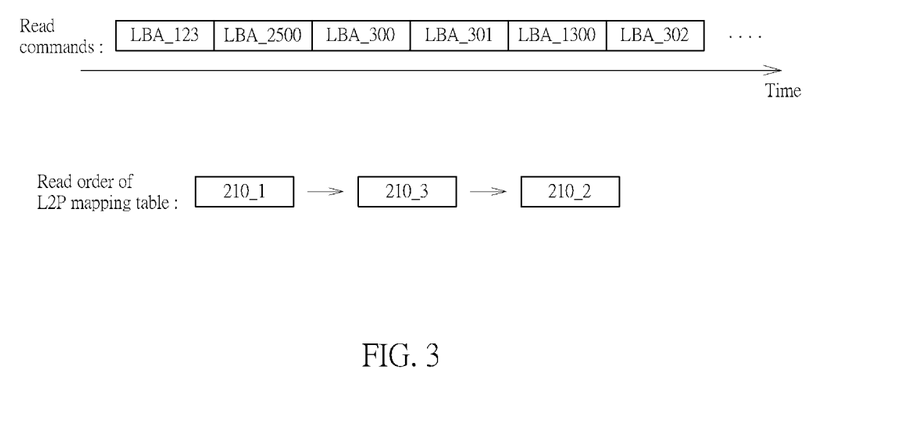
FIG. 3 is a diagram illustrating a plurality of read commands and the reading order of the L2P mapping tables.
Figure 4:
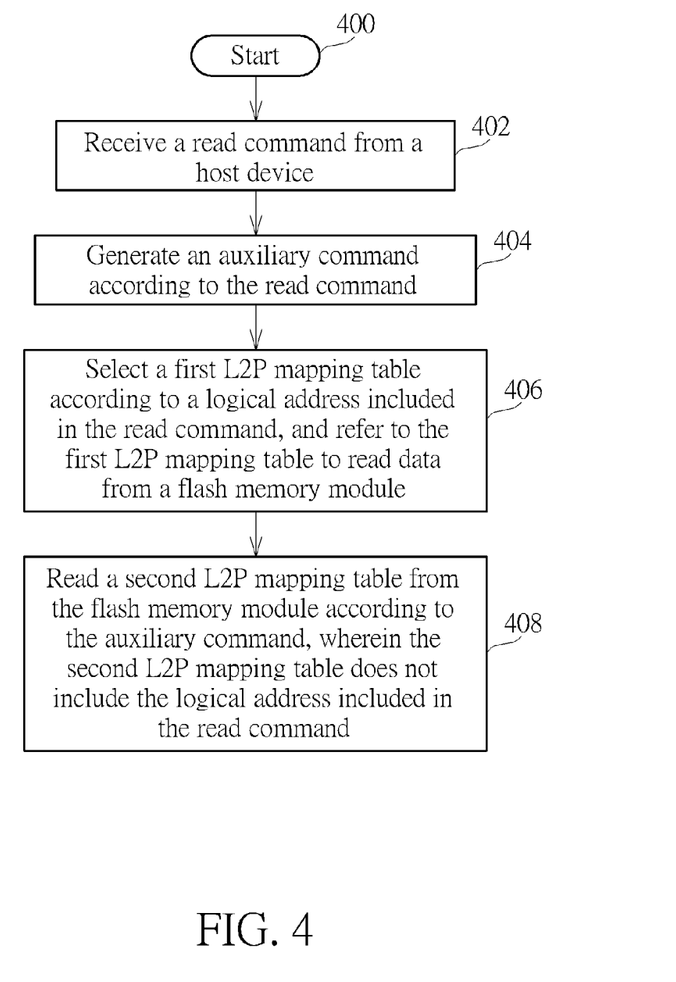
FIG. 4 is a flowchart of a method for accessing the memory module according to one embodiment of the present invention.

FIG. 4 is a flowchart of a method for accessing the memory module 130 according to one embodiment of the present invention. Refer to FIG. 1-FIG. 3 and the related descriptions, the flow is described as follow.

Step 400: the flow starts.

Step 402: receive a read command from a host device 110.

Step 404: generate an auxiliary command according to the read command.

Step 406: select a first L2P mapping table according to a logical address included in the read command, and refer to the first L2P mapping table to read data from a memory module 130.

Step 408: read a second L2P mapping table from the memory module 130 according to the auxiliary command, wherein the second L2P mapping table does not include the logical address included in the read command.

Briefly summarized, in the memory controller of the present invention, the AI module is provided to predict a L2P mapping table required in the future, and the predicted L2P mapping table is read from the memory module and is stored in the buffer memory, in order to process the read command faster to transmit the data to the host device when receiving the associated read command(s) later. In other words, before receiving the next read command of the current read command, the memory controller 120 of the present invention can predict the next read command of the current read command and load the required L2P mapping table according to the predicted next read command. By using the embodiments of the present invention, the data reading speed becomes faster and the system efficiency is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller configured to receive a first read command and a second read command from a host device, the memory controller, comprising:
   an artificial intelligence (AI) module, to generate an auxiliary command according to the first read command and at least one decision logic; and
   a microprocessor, coupled to the AI module, to select a first logical address to physical address mapping table (L2P mapping table) according to a logical address included in the first read command, and to refer to the first L2P mapping table to read data from a memory module;
   a buffer memory, coupled to the microprocessor, storing a second L2P mapping table from the memory module in direct response to the auxiliary command, wherein the second L2P mapping table does not include the logical address included in the first read command, wherein the second L2P mapping table is buffered in the buffer memory before the memory controller receives the second read command, wherein the second read command is a consecutive read command to the first read command, with respect to a command ordering.

2. The memory controller of claim 1, wherein the buffer memory stores the second L2P mapping table from the memory module before the microprocessor receives an access command that requires the second L2P mapping table.

3. The memory controller of claim 1, wherein before the memory controller receives the first read command from the host device, the AI module receives a plurality of specific read commands associated with the first read command many times to generate/update the at least one decision logic.

4. The memory controller of claim 3, wherein the plurality of specific read commands comprise at least one first read command and at least one second read command, the at least one first read command and the read command have a same logical address, and the at least one second read command is after the at least one first read command at a time of receipt.

5. The memory controller of claim 3, wherein the AI module refers to a user's setting to receive the plurality of specific read commands from the host device many times, to generate/update the at least one decision logic.

6. The memory controller of claim 1, wherein the AI module comprises an artificial neural network (ANN) architecture, the at least one decision logic is weighting values of nodes of the ANN architecture.

7. The memory controller of claim 6, wherein the ANN architecture is one of Deep Convolutional Network (DCN) architecture and Neural Turing Machine (NTM) architecture.

8. The memory controller of claim 6, wherein at least two inputs of the ANN architecture are at least two of a logical block address of the access command, length of the access command, a type of the access command, and an interval time of the access command.

9. The memory controller of claim 1, wherein the auxiliary command comprises an index of the second L2P mapping table.

10. The memory controller of claim 1, wherein the auxiliary command comprises a logical block address.

11. A method for accessing a memory module, comprising:
   receiving a read command from a host device;
   generating an auxiliary command according to the read command and at least one decision logic;
   selecting a first logical address to physical address mapping table (L2P mapping table) according to a logical address included in the read command;
   referring to the first L2P mapping table to read data from a memory module;
   directly buffering a second L2P mapping table in the memory module in response to the auxiliary command;
   reading the second L2P mapping table from the memory module, wherein the second L2P mapping table does not include the logical address included in the read command; and
   receiving an access command that requires the second L2P mapping table from a host device;
   wherein the step of reading the second L2P mapping table from the memory module is before the step of receiving the access command that requires the second L2P mapping table, wherein the access command is a consecutive read command to the read command, with respect to a command order.

12. The method of claim 11, wherein the step of selecting the first L2P mapping table according to the logical address included in the read command comprises:
   reading the first L2P mapping table from the memory module according to the logical address included in the read command.

13. The method of claim 11, the method further comprising:
   receiving a plurality of specific access commands associated with the read command many times to generate/update the at least one decision logic;
   wherein the step of receiving the plurality of specific read commands is before the step of receiving the read command.

14. The method of claim 13, wherein the plurality of specific read commands comprise at least one first read command and at least one second read command, the at least one first read command and the read command have a same logical address, and the at least one second read command is after the at least one first read command at a time of receipt.

15. The method of claim 13, wherein the method is executed by an electronic device, wherein the step of receiving the plurality of specific read commands associated with the read command many times to generate/update the decision logic according to a user's setting, wherein the user's setting is at least one specific period that the electronic device executes a specific operation.

16. The method of claim 11, wherein the at least one decision logic is weighting values of an artificial neural network (ANN) architecture.

17. The method of claim 16, wherein the ANN architecture is one of Deep Convolutional Network (DCN) architecture and Neural Turing Machine (NTM) architecture.

18. The method of claim 11, wherein the at least one decision logic is updated according to at least one of a logical block address of the access command, length of the access command, a type of the access command, and an interval time of the access command.

* * * * *